United States Patent
Zhu

(10) Patent No.: US 8,519,762 B2
(45) Date of Patent: Aug. 27, 2013

(54) ADJUSTING CIRCUIT OF DUTY CYCLE AND ITS METHOD

(75) Inventor: Guojun Zhu, Chengdu (CN)

(73) Assignee: IPGoal Microelectronics (SiChuan) Co., Ltd., Chengdu, Sichuan Province (CN)

(*) Notice: Subject to any disclaimer, the term of this patent is extended or adjusted under 35 U.S.C. 154(b) by 0 days.

(21) Appl. No.: 13/454,090

(22) Filed: Apr. 24, 2012

(65) Prior Publication Data
US 2012/0280733 A1 Nov. 8, 2012

(30) Foreign Application Priority Data
May 3, 2011 (CN) .......................... 2011 1 0111961

(51) Int. Cl.
*H03K 3/017* (2006.01)
(52) U.S. Cl.
USPC .......................................... 327/172; 327/147
(58) Field of Classification Search
None
See application file for complete search history.

(56) References Cited

U.S. PATENT DOCUMENTS

| | | | | |
|---|---|---|---|---|
| 5,382,923 A | * | 1/1995 | Shimada et al. | 331/8 |
| 6,147,531 A | * | 11/2000 | McCall et al. | 327/158 |
| 6,448,828 B2 | * | 9/2002 | Stark et al. | 327/175 |
| 7,432,752 B1 | * | 10/2008 | Lee et al. | 327/175 |

* cited by examiner

*Primary Examiner* — Cassandra Cox

(57) ABSTRACT

An adjusting circuit of duty cycle includes an edge detecting circuit, a flip-flop connected to the edge detecting circuit, a feedback control circuit connected to the flip-flop and a charge pump circuit connected to the feedback control circuit. The edge detecting circuit detects an edge of an inputted clock signal. The flip-flop sets an outputting terminal thereof at a first level according to a clock signal outputted by the edge detecting circuit. The charge pump circuit controls a duration of the first level outputted the outputting terminal of the flip-flop by charging and discharging a capacitor. The flip-flop sets the outputting terminal thereof at a second level contrary to the first level according to a clock signal outputted by the feedback control circuit. An adjusting method of duty cycle is also disclosed. The adjusting circuit of duty cycle has a simple structure, a stable performance and a fast speed.

9 Claims, 3 Drawing Sheets

ADJUSTING CIRCUIT OF DUTY CYCLE AND ITS METHOD

BACKGROUND OF THE PRESENT INVENTION

1. Field of Invention

The present invention relates to an adjusting circuit and its method, and more particularly to an adjusting circuit of duty cycle able to produce an arbitrary duty cycle and a method thereof.

2. Description of Related Arts

The adjusting circuit of duty cycle plays an important role in the transmission of high-speed clock signals. The conventional adjusting circuits of duty cycle function through adjusting the turn thresholds of signal transmission, wherein the duty cycle is adjusted by raising or reducing the turn threshold to change the pulse widths of high and low levels.

However, the conventional adjusting circuit of duty cycle usually has a complicated structure and needs peripheral circuits to provide biasing, which complicates the clock path and brings difficulty to the overall arrangement of the integrated circuit.

SUMMARY OF THE PRESENT INVENTION

Thus it is necessary to provide an adjusting circuit of duty cycle which has a simple structure and is able to produce an arbitrary duty cycle and a method thereof.

The adjusting circuit of duty cycle comprises an edge detecting circuit, a flip-flop connected to the edge detecting circuit, a feedback control circuit connected to the flip-flop and a charge pump circuit connected to the feedback control circuit. The edge detecting circuit is for detecting an edge of an inputted clock signal. An outputting terminal of the flip-flop is set at a first level by the flip-flop according to a clock signal outputted by the edge detecting circuit. The charge pump circuit controls a duration of the first level outputted by the outputting terminal of the flip-flop by charging and discharging a capacitor. The outputting terminal of the flip-flop is provided at a second level contrary to the first level by the flip-flop according to a clock signal outputted by the feedback control circuit.

An adjusting method of duty cycle comprises following steps of:

inputting a first clock signal into an edge detecting circuit by a clock signal inputting terminal;

detecting an edge of the first clock signal, outputting a second clock signal corresponding to the first clock signal and sending the second clock signal into a flip-flop by the edge detecting circuit;

according to the second clock signal, setting an outputting terminal of the flip-flop at a first level by the flip-flop; and charging and discharging a capacitor by a charge pump circuit so as to control a duration of the first level of the outputting terminal of the flip-flop, setting the outputting terminal of the flip-flop at a second level contrary to the first level by the flip-flop according to a clock signal outputted by a feedback control circuit.

Compared to conventional arts, the adjusting circuit of duty cycle and its method according to the present invention control the duration of the first level and a duration of the second level of the outputted clock signals through detecting the edge of the inputted clock signal by the edge detecting circuit and controlling proportions of a charging current and a discharging current of the charge pump circuit, so as to control a duty cycle of the outputted clock signals. The adjusting circuit of duty cycle of the present invention has a simple structure, a stable adjusting performance and a fast operation speed.

DETAILED DESCRIPTION OF THE PREFERRED EMBODIMENT

Figure 1:
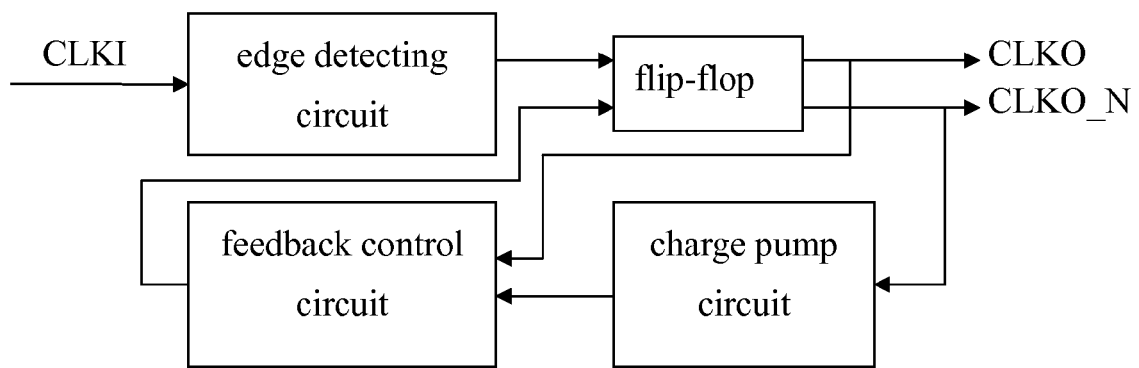
FIG. 1 is a block diagram of an adjusting circuit of duty cycle according to a preferred embodiment of the present invention.
Figure 2:
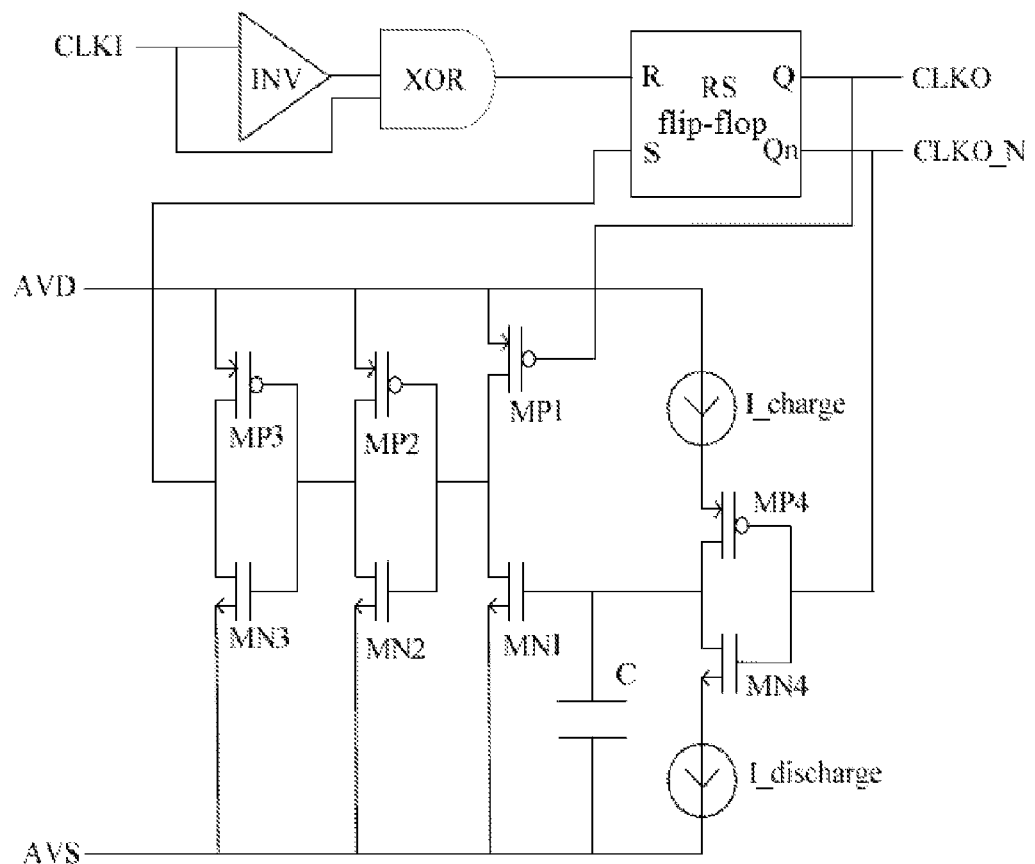
FIG. 2 is a sketch view of the adjusting circuit of duty cycle according to the preferred embodiment of the present invention.

Referring to FIG. 1 and FIG. 2 of the drawings, according to a preferred embodiment of the present invention, an adjusting circuit of duty cycle comprises a clock signal inputting terminal CLKI, an edge detecting circuit connected to the clock signal inputting terminal CLKI, a flip-flop connected to the edge detecting circuit, a first outputting terminal CLKO connected to the flip-flop, a second outputting terminal CLKO_N, a feedback control circuit and a charge pump circuit connected to the feedback control circuit. The edge detecting circuit comprises an inverter INV, an exclusive-OR gate (XOR) connected to the inverter INV. The feedback control circuit comprises a first switching element connected to the first outputting terminal CLKO, a second switching element, a third switching element, a fourth switching element, a fifth switching element and a sixth switching element. The charge pump circuit comprises a charging current source I_charge, a discharging current source I_discharge, a seventh switching element connected to the second outputting terminal CLKO_N, an eighth switching element connected to the second outputting terminal CLKO_N and a capacitor C connected to the seventh switching element and the eighth switching element.

According to the preferred embodiment of the present invention, the flip-flop is a RS flip-flop; the first switching element is a first field effect transistor (FET) MP1; the second switching element is a second FET MP2; the third switching element is a third FET MP3; the fourth switching element is a fourth FET MN1; the fifth switching element is a fifth FET MN2; the sixth switching element is a sixth FET MN3; the seventh switching element is a seventh FET MP4; the eighth switching element is an eighth switching FET MN4. The first FET MP1, the second FET MP2, the third FET MP3 and the seventh FET MP4 are p-channel metal-oxide-semiconductor (PMOS) FETs. The fourth FET MN1, the fifth FET MN2, the sixth FET MN3 and the eighth FET MN4 are n-channel metal-oxide-semiconductor (NMOS) FETs. The switching elements can be other switching devices or circuits having similar functions based on practical needs in other preferred embodiments of the present invention.

The edge detecting circuit is for detecting an edge of a first clock signal inputted by the clock signal inputting terminal CLKI, outputting a second clock signal corresponding to the first clock signal and sending the second clock signal into the RS flip-flop. The RS flip-flop receives the second clock signal through a terminal R and sets a non-inverting outputting terminal Q at a first level according to the second clock signal. Then the RS flip-flop receives a clock signal outputted by the feedback control circuit through a terminal S and sets the terminal Q at a second level contrary to the first level according to the clock signal outputted by the feedback control circuit. The feedback control circuit is for controlling a switching between the first level and the second level of clock signals outputted by the terminal Q of the RS flip-flop. The charge pump circuit is for detecting a duty cycle of the clock signal outputted by the terminal Q of the RS flip-flop, converting the detected duty cycle into a voltage signal and then controlling durations of the first level and the second level of the clock signals outputted by the terminal Q through the feedback control circuit. The clock signal outputted by the terminal Q of the RS flip-flop and a clock signal outputted by an inverting inputting terminal Qn are mutually a pair of differential signals.

According to the preferred embodiment of the present invention, the edge detecting circuit detects a leading edge of the first clock signal inputted by the clock signal inputting terminal CLKI, outputs the second clock signal and sends the second clock signal into the RS flip-flop; the RS flip-flop receives the second clock signal through the R terminal and sets the terminal Q at a high level according to the second clock signal; then the RS flip-flop receives the clock signal outputted by the feedback control circuit through the terminal S and sets the terminal Q at a low level according to the clock signal outputted by the feedback control circuit; the feedback control circuit controls a switching between the high level and the low level of the clock signals outputted by the terminal Q of the RS flip-flop; the charge pump circuit detects the duty cycle of the clock signal outputted by the terminal Q of the RS flip-flop, converts the detected duty cycle into the voltage signal and controls a duration of the high level of the clock signal outputted by the terminal Q through the feedback control circuit.

According to the preferred embodiment of the present invention, specific connections of the adjusting circuit of duty cycle are following. An inputting terminal of the inverter INV of the edge detecting circuit and a first inputting terminal of the XOR gate XOR are connected to the clock signal inputting terminal CLKI; an outputting terminal of the inverter INV is connected to a second inputting terminal of the XOR gate XOR; an outputting terminal of the XOR gate XOR is connected to a first inputting terminal R of the RS flip-flop; a non-inverting outputting terminal Q of the RS flip-flop is connected to the first outputting terminal CLKO; an inverting outputting terminal Qn of the RS flip-flop is connected to the second outputting terminal CLKO_N. A grid electrode of the seventh FET MP4 and a grid electrode of the eighth FET MN4 are connected to the second outputting terminal CLKO_N; a source electrode of the seventh FET MP4 is connected to a first terminal of the charging current source I_charge; a drain electrode of the seventh FET MP4 is connected to a drain electrode of the eighth FET MN4, a first terminal of the capacitor C and a grid electrode of the fourth FET MN1; a source electrode of the eighth FET MN4 is connected to a first terminal of the discharging current source I_discharge. A grid electrode of the first FET MP1 is connected to the first outputting terminal CLKO; a drain electrode of the first FET MP1 is connected to a grid electrode of the second FET MP2, a grid electrode of the fifth FET MN2 and a drain electrode of the fourth FET MN1; a drain electrode of the second FET MP2 is connected to a grid electrode of the third FET MP3, a grid electrode of the sixth FET MN3 and a drain electrode of the fifth FET MN2; a drain electrode of the third FET MP3 is connected to a second inputting terminal S of the RS flip-flop and a drain electrode of the sixth FET MN3. A second terminal of the charging current source I_charge, a source electrode of the first FET MP1, a source electrode of the second FET MP2 and a source electrode of the third FET MP3 are all connected to a power source terminal AVD; a second terminal of the discharging current source I_discharge, a second terminal of the capacitor C, a source electrode of the fourth FET MN1, a source electrode of the fifth FET MN2 and a source electrode of sixth FET MN3 are all connected to an earth terminal AVS.

According to the preferred embodiment of the present invention, working principles of the adjusting circuit of duty cycle are following. The edge detecting circuit detects a leading edge of a clock signal inputted by the clock signal inputting terminal CLKI. The edge detecting circuit outputs a short pulse relative to the leading edge of the inputted clock signal. When the edge detecting circuit outputs a clock signal having a high level and the terminal R of the RS flip-flop is high, a clock signal outputted by the terminal Q keeps at a high level, i.e., the RS flip-flop receives the clock signal outputted by the edge detecting signal through the terminal R and sets the terminal Q at a high level according to the clock signal outputted by the edge detecting circuit. The charge pump circuit detects a duty cycle of the clock signal outputted by the terminal Q of the RS flip-flop by charging and discharging the capacitor C, converts the detected duty cycle into a voltage signal and controls a duration of the high level of the clock signal outputted by the terminal Q through the feedback control circuit. When the first outputting terminal CLKO is at a high level and the second outputting terminal CLKO_N is at a low level, the charge pump circuit charges the capacitor C; a voltage of the grid electrode of the third FET MN1 increases and a voltage of the drain electrode thereof decreases. When the voltage of the drain electrode of the third FET MN1 decreases to a level of an inverting voltage of the inverter INV comprising the second FET MP2 and the fifth FET MN2, the terminal S of the RS flip-flop is 0 and the clock signal outputted by the first outputting terminal CLKO changes from a high level into a low level.

The charge pump circuit has a charging current source I_charge and a discharging current source I_discharge. Supposing that the duration of the high level of the clock signal outputted by the first outputting terminal CLKO is Th and the duration of the low level thereof is T1, when the adjusting circuit of duty cycle is working stably, $$I\_charge * Th = I\_discharge * T1$$

Thus the duty cycle of the outputted clock signal is $$Th/(Th+T1) = I\_discharge/(I\_discharge + I\_charge)$$

Thus the adjusting circuit of duty cycle is able to produce an outputting clock having an arbitrary duty cycle by controlling proportions of a charging current and a discharging current.

Figure 3:
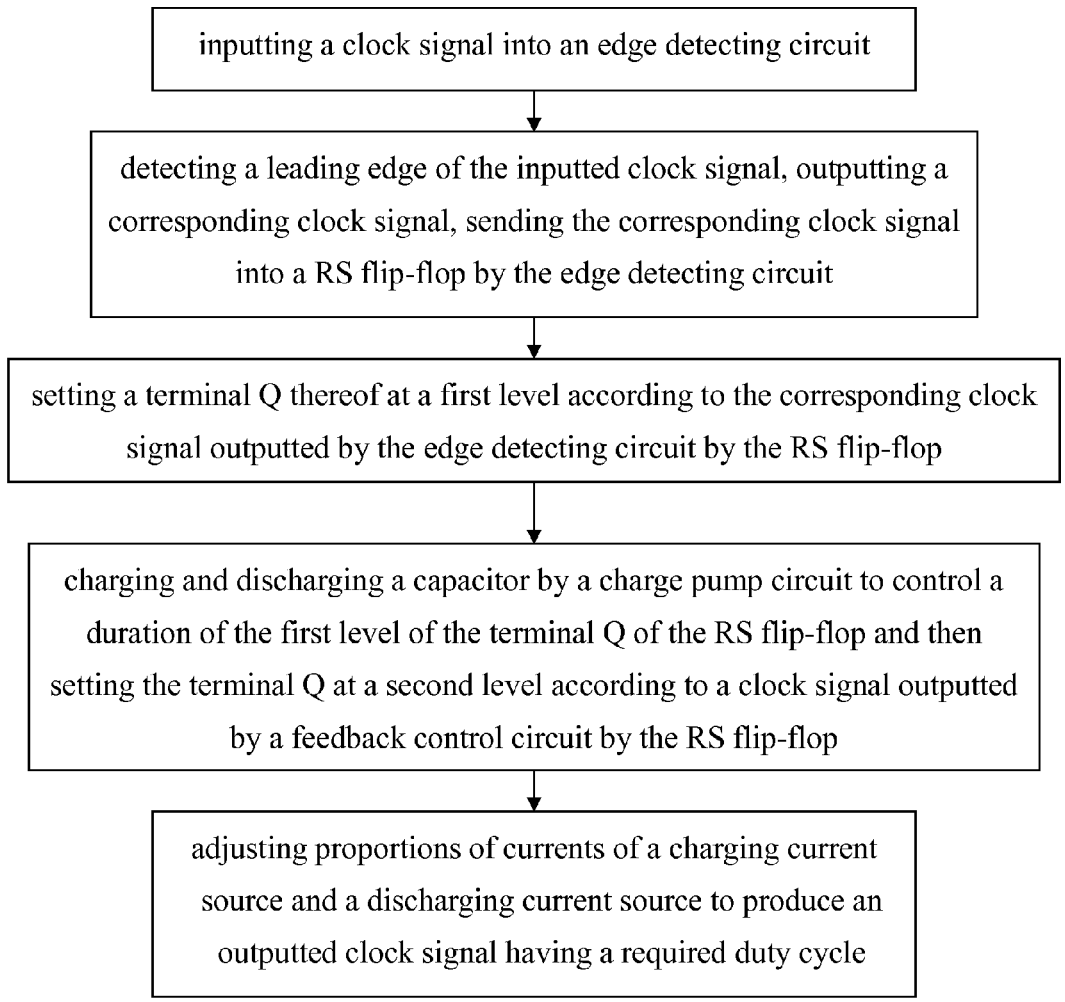
FIG. 3 is a flow chart of an adjusting method of duty cycle according to the preferred embodiment of the present invention.

Referring to FIG. 3, according to the preferred embodiment of the present invention, the adjusting method of duty cycle comprises following steps of:

step one, inputting a first clock signal into an edge detecting circuit by a clock signal inputting terminal CLKI;

step two, detecting an edge of the first clock signal, outputting a second clock signal corresponding to the first clock signal and sending the second clock signal into a RS flip-flop by the edge detecting circuit;

step three, setting a terminal Q of the RS flip-flop at a first level by the RS flip-flop according to the second clock signal;

step four, charging and discharging a capacitor C by a charge pump circuit, controlling a duration of the first level outputted by the terminal Q of the RS flip-flop through a feedback control circuit and setting the terminal Q at a second level contrary to the first level by the RS flip-flop according to a clock signal outputted by the feedback control circuit;

step five, adjusting proportions of currents of a charging current source I_charge and a discharging current source I_discharge to produce an outputting clock signal having a required duty cycle.

The adjusting circuit of duty cycle and its method according to the present invention control the durations of the first level and the second level of the outputted clock signal through detecting the edge of the inputted clock signal by the edge detecting circuit and controlling the proportions of the charging current and discharging current of the charge pump circuit, so as to control the duty cycle of the outputted clock signal. The adjusting circuit of duty cycle of the present invention has a simple structure, a stable adjusting performance and a fast operation speed.

What is claimed is:

1. An adjusting circuit of duty cycle comprising an edge detecting circuit, a flip-flop connected to said edge detecting circuit, a feedback control circuit connected to said flip-flop and a charge pump circuit connected to said feedback control circuit, wherein said edge detecting circuit is for detecting an edge of an inputted clock signal; said flip-flop sets an outputting terminal of said flip-flop at a first level according to a clock signal outputted by said edge detecting circuit; said charge pump circuit is for controlling a duration of said first level outputted by said outputting terminal of said flip-flop by charging and discharging a capacitor; said flip-flop sets said outputting terminal of said flip-flop at a second level contrary to said first level according to a clock signal outputted by said feedback control circuit;

wherein said flip-flop is a RS flip-flop; said edge of said inputted clock signal is a leading edge; said first level is a high level and said second level is a low level; said adjusting circuit of duty cycle further comprises a clock signal inputting terminal connected to said edge detecting circuit, a first outputting terminal connected to said RS flip-flop and a second outputting terminal; said inputted clock signal is inputted by said clock signal inputting terminal; said first outputting terminal is connected to said feedback control circuit; said second outputting terminal is connected to said charge pump circuit.

2. The adjusting circuit of duty cycle, as recited in claim 1, wherein said feedback control circuit comprises a first switching element connected to said first outputting terminal, a second switching element, a third switching element, a fourth switching element, a fifth switching element and a sixth switching element; said charge pump circuit comprises a charging current source, a discharging current source, a seventh switching element connected to said second outputting terminal, an eighth switching element and a capacitor.

3. The adjusting circuit of duty cycle, as recited in claim 2, wherein said first switching element is a first field effect transistor (FET); said second switching element is a second FET; said third switching element is a third FET; said fourth switching element is a fourth FET; said fifth switching element is a fifth FET; said sixth switching element is a sixth FET; said seventh switching element is a seventh FET; said eighth switching element is an eighth FET.

4. The adjusting circuit of duty cycle, as recited in claim 3, wherein an inputting terminal of said edge detecting circuit is connected to said clock signal inputting terminal; an outputting terminal of said edge detecting circuit is connected to a first inputting terminal of said RS flip-flop; a non-inverting outputting terminal of said RS flip-flop is connected to said first outputting terminal; an inverting outputting terminal of said RS flip-flop is connected to said second outputting terminal.

5. The adjusting circuit of duty cycle, as recited in claim 4, wherein a grid electrode of said seventh FET and a grid electrode of said eighth FET are connected to said second outputting terminal; a source electrode of said seventh FET is connected to said charging current source; a drain electrode of said seventh FET is connected to a drain electrode of said eighth FET, a first terminal of said capacitor and a grid electrode of said fourth FET; a source electrode of said eighth FET is connected to a first terminal of said discharging current source.

6. The adjusting circuit of duty cycle, as recited in claim 5, wherein a grid electrode of said first FET is connected to said first outputting terminal; a drain electrode of said first FET is connected to a grid electrode of said second FET, a grid electrode of said fifth FET and a drain electrode of said fourth FET; a drain electrode of said second FET is connected to a grid electrode of said third FET, a grid electrode of said sixth FET and a drain electrode of said fifth FET; a drain electrode of said third FET is connected to a second inputting terminal of said RS flip-flop and a drain electrode of said sixth FET.

7. The adjusting circuit of duty cycle, as recited in claim 6, wherein a second terminal of said charging current source, a source electrode of said first FET, a source electrode of said second FET and a source electrode of said third FET are all connected to a power source terminal; a second terminal of said discharging current source, a second terminal of said capacitor, a source electrode of said fourth FET, a source electrode of said fifth FET and a source electrode of said sixth FET are all connected to an earth terminal.

8. An adjusting method of duty cycle comprising following steps of:

inputting a first clock signal into an edge detecting circuit by a clock signal inputting terminal;

detecting an edge of the first clock signal, outputting a second clock signal corresponding to the first clock signal and sending the second clock signal into a flip-flop by the edge detecting circuit;

setting an outputting terminal of the flip-flop at a first level according to the second clock signal by the flip-flop, outputting the first level via a first outputting terminal connected between the flip-flop and a charge pump circuit and correspondently outputting a second level contrary to the first level via a second outputting terminal connected between the flip-flop and a feedback control circuit; and charging or discharging a capacitor by the charge pump circuit to control a duration of the first level of the outputting terminal of the flip-flop and setting the outputting terminal of the flip-flop at the second level according to a clock signal outputted by the feedback control circuit by the flip-flop.

9. The adjusting method of duty cycle, as recited in claim 8, wherein the charge pump circuit comprises a charging current source and a discharging current source; the adjusting method of duty cycle further comprises adjusting proportions of currents produced by the charging current source and the discharging current source to produce an outputted clock signal having a required duty cycle according to requirements.

* * * * *